United States Patent [19]

Gorokhovsky

[11] Patent Number: 5,435,900
[45] Date of Patent: Jul. 25, 1995

[54] APPARATUS FOR APPLICATION OF COATINGS IN VACUUM

[76] Inventor: Vladimir I. Gorokhovsky, 10 Stonedene Blvd., Willowdale, Ontario, Canada, M2R 3C7

[21] Appl. No.: 145,571

[22] Filed: Nov. 4, 1993

[30] Foreign Application Priority Data

Nov. 4, 1992 [UA] Ukraine .................... 93020179

[51] Int. Cl.⁶ .................. C23C 14/22; H01L 21/00
[52] U.S. Cl. .................. 204/298.41; 204/192.38; 118/723 R
[58] Field of Search .... 118/723 R, 723 MR, 723 HC, 118/723 FE, 723 FI, 723 DC; 315/111.21, 111.41, 111.71; 156/345; 204/192.38, 298.41

[56] References Cited

U.S. PATENT DOCUMENTS

| | | |
|---|---|---|
| 4,452,686 | 6/1984 | Axenov et al. ............. 204/298 |
| 4,492,845 | 1/1985 | Kljuchko et al. ............ 219/121 |
| 4,929,321 | 5/1990 | Buhl .......................... 204/192.38 |
| 5,009,922 | 4/1991 | Harano ....................... 427/37 |
| 5,279,723 | 1/1994 | Falabella et al. ........... 204/192.38 |
| 5,282,944 | 2/1994 | Sanders ..................... 204/192.38 |

OTHER PUBLICATIONS

P. J. Martin et al., The Deposition of Thin Films by Filtered Arc Evaporation, 1992, pp. 136–142.

*Primary Examiner*—R. Bruce Breneman
*Assistant Examiner*—Joni Y. Chang

[57] ABSTRACT

An apparatus for the production of coatings in a vacuum provides a plasma guide in the shape of a parallelepiped having a substrate holder and plasma source on adjacent planes. A magnetic deflecting system is formed by linear conductors arranged along the edges of the parallelepiped, comprising 1, 2, 3 or 4 rectangular coils for controlling the plasma flow.

6 Claims, 3 Drawing Sheets

APPARATUS FOR APPLICATION OF COATINGS IN VACUUM

FIELD OF THE INVENTION

This invention relates to the application of coatings in a vacuum, and particularly to an apparatus which generates a plasma of electrically conducting materials, i.e. an apparatus designed for the application of coatings to various surfaces in a vacuum by way of condensation of plasma. The apparatus can be used in mechanical engineering, instrument and tool making, in the production of electronic equipment, and in other fields of industry.

BACKGROUND OF THE INVENTION

An apparatus of this nature has been described in the article "Properties of Tetrahedral Amorphous Carbon Prepared by Vacuum Arc Deposition", *Diamond and Related Materials* published in the United States by D. R. McKenzie in 1991 (pages 51 through 59).

This apparatus consists of a plasma guide made as a quarter section of a tore surrounded by a magnetic system that directs the plasma current. The plasma guide communicates with two chambers, one of which accommodates a plasma source and the other, the main chamber which accommodates a substrate holder. Due to the design of the plasma guide the substrate holder is installed off the optical axis of the plasma source. The plasma source and the substrate holder are surrounded by focusing electromagnets. The disadvantage of this apparatus lies in the fact that the dimensions of the article to be coated are limited. The form of a tore limits the dimensions of the article to be coated to 200 mm which significantly limits the range of its application.

Furthermore, there is no provision in the tore-shaped plasma guide for changing the configuration of the magnetic field. One can only change the magnetic field intensity. The maximum value of the ionic current at the exit of the plasma guide does not exceed 1 percent of the arc current. This relates in the first place to the turbulence of the plasma current in the tore, which causes a drastic rise in the diffusion losses of ions on the tore walls (the coefficient of the turbulent diffusion being $D \sim 1/H$, where H is the magnetic field intensity).

The advantages which the claimed invention provides consist of increasing the range of dimensions of articles (substrates) to be coated, and providing the user with the option of changing the configuration of the magnetic field in order to increase ionic current at the exit of the plasma guide to 2 to 3 percent of the arc current.

This advantage arises because the present apparatus for the application of coatings in a vacuum incorporates the plasma guide surrounded by the deflecting magnetic system, the plasma source and the substrate holder mounted in the main chamber off of the optical axis of the plasma source. The plasma source and the substrate holder are surrounded by the focusing electromagnets. The invention provides that the plasma guide is made in the form of a parallelepiped on adjacent planes of which the substrate holder and the plasma source are mounted. The magnetic system that forces the plasma current towards the substrate is made up of linear conductors arranged along the edges of the parallelepiped. The plasma guide has plates with diaphragm filters connected to the positive pole of the current source and mounted on one or more planes (not occupied by the plasma source) of the plasma guide.

There are provided different embodiments of the magnetic systems of the present invention to suit different applications. For example, the magnetic system can be made in the form of a diagonal coil (see FIG. 1).

In a further embodiment (FIG. 2a) the magnetic system can be formed by two rectangular coils mounted on two adjacent planes of the plasma guide, one of the coils adjoining the main chamber and the other being located on the side opposite the plasma source.

In a third embodiment (FIG. 2b) the magnetic system can be formed by three rectangular coils. One of the coils is located along the side of the plasma source, another is located along the opposite side and the third coil is arranged along the side opposite the edge adjoining the main chamber. This embodiment is additionally equipped with two plasma sources, both sources being mounted in opposition to each other in one axis.

In a fourth embodiment (FIG. 2c) the magnetic system can be formed by four rectangular coils. In this case, one rectangular coil is added to the three-coil embodiment. The additional coil is located along on the side of the substrate holder.

There is also a further embodiment of the apparatus wherein the plasma guide is mounted inside the main chamber. In this case, its magnetic system is contained in a metal shell connected to the positive pole of the current source, whereas the walls of the plasma guide are provided by the above-mentioned plates with the diaphragm filters.

The claimed invention provides that by changing the currents in the linear conductors, which form the magnetic fields, one can obtain a configuration of the magnetic field which suppresses plasma turbulence, and the amount of the diffusion current of ions of the plasma on the walls of the plasma guide is reduced to the minimum corresponding to the classical diffusion formula $D \sim 1/H^2$. Under these circumstances the magnitude of the ionic current at the exit of the plasma guide reaches 2 to 3 percent of the arc current. Simultaneously, the efficiency of the macroparticle separation system is increased due to the use of plates fitted with diaphragm filters located on one or more planes of the plasma guide free from the plasma source. The plates are connected to the positive pole of the current source. The negative pole can be connected to the cathode of the plasma source via a variable resistor. With this connection an electric field occurs between the walls of the plasma guide which forces the ions towards the substrates (see FIG. 1).

If, for example, the potential of the plate ($V_p$) located opposite the plasma source is greater than the potential of the plasma source wall ($V_w$), an electric field occurs between them. The intensity of the field is:

$$E_1 \sim \frac{V_p - V_W}{d}$$

where d is the distance between the plate and the plasma guide wall.

An ion is influenced by the force:

$$F_i = Q_i \times E_1,$$

where $Q_i$ is the ion charge.

This force causes the ion to turn away from the wall opposite the plasma source and sends it toward the substrate.

By adjusting the potential of the plates located on the walls not occupied by the plasma source, one can obtain the optimal configuration of the magnetic field and, as a consequence, increase the amount of ions of the coating material. It should be apparent that in the prior art apparatus this feature is not available, because there the potential of the tore can be varied only as a whole.

The claimed invention makes it possible to apply coatings to large surfaces, as the configuration of the plasma guide in the present apparatus produces rectangular cross-section plasma currents of virtually any rectangle size, whereas the prior art apparatus produces only a circular-shaped current limited in diameter by the diameter of the tore (and in any event not more than 200 mm).

SUMMARY OF THE INVENTION

The present invention thus provides an apparatus for the application of coatings in a vacuum comprising a plasma guide surrounded by a magnetic deflecting system communicating with a first plasma source and contained within the plasma guide and a main chamber adjoining the plasma guide in which a substrate holder is arranged off of an optical axis of the plasma source, the plasma source being surrounded by electromagnets, characterized in that the plasma guide has the form of a parallelepiped and, the magnetic deflecting system is formed by linear conductors arranged along edges of the parallelepiped, the plasma guide being provided with plates carrying diaphragm filters, the plates being connected to the positive pole of a current source and installed on one or more planes of the plasma guide which are not occupied by the plasma source.

BRIEF DESCRIPTION OF THE DRAWINGS

In drawings which illustrate by way of example only a preferred embodiment of the invention.

DETAILED DESCRIPTION OF THE INVENTION

Figure 1:
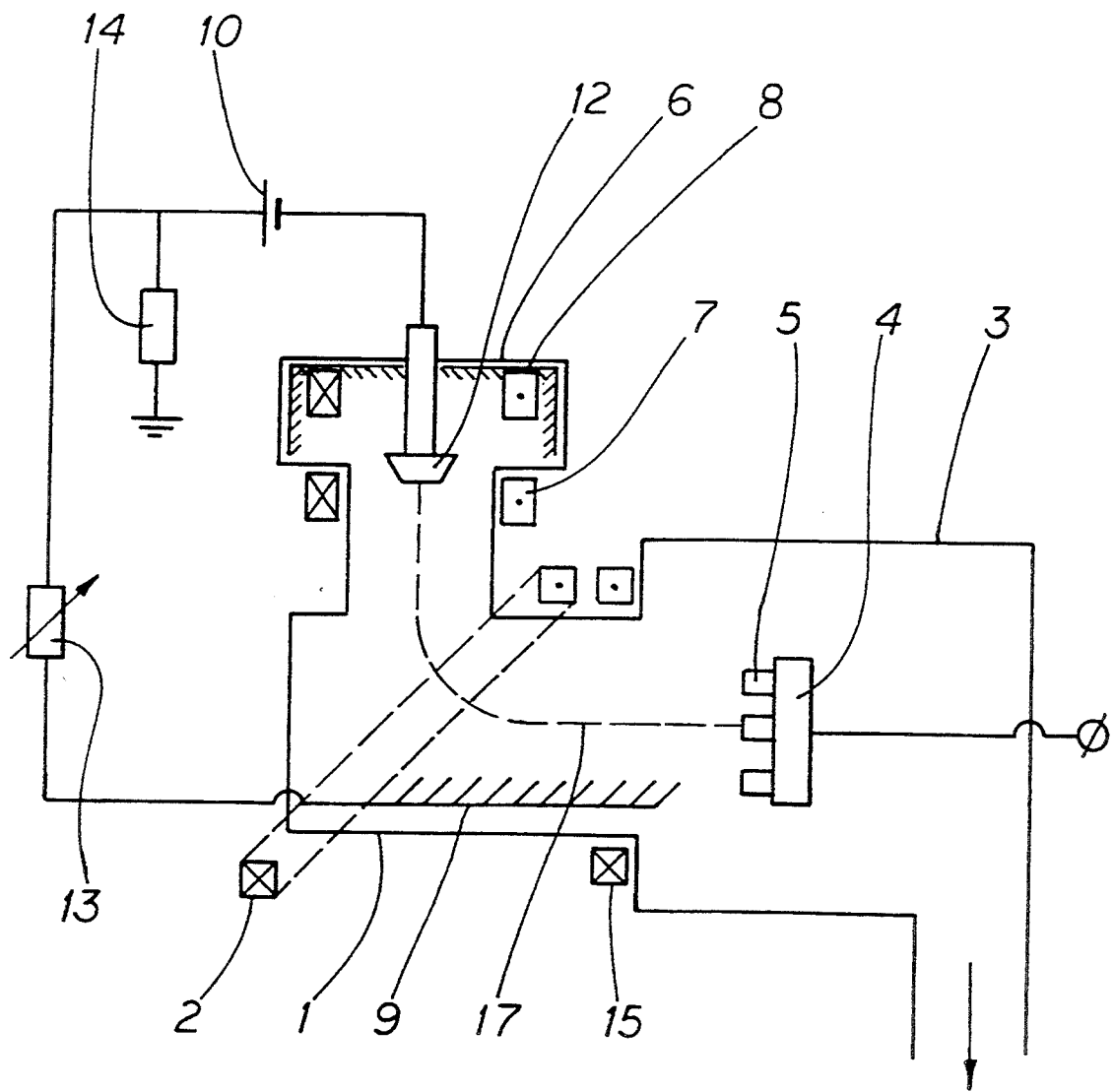
FIG. 1 is a schematic view of the apparatus of the present invention.

The basic apparatus for the application of coatings in a vacuum is illustrated in FIG. 1. The deflecting magnetic system is made in the form of a rectangular coil 2 formed from linear conductors 2 arranged diagonally along the plasma guide 1 made in the form of a parallelepiped.

Figure 2A:
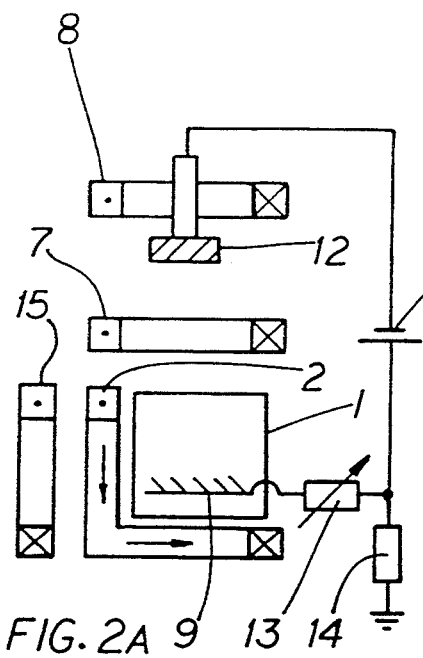
FIGS. 2a, b and c are schematic views of embodiments of the invention having 2, 3 or 4 rectangular coils, respectively.

The magnetic system consists of linear conductors 2 arranged along the edges of the parallelepiped, as shown in FIG. 1, or one, two, three, or four rectangular coils mounted on the exterior of the plasma guide as shown in FIGS. 1, 2a, b and c, respectively. Each of the rectangular coils has two linear conductors and two circuit closing conductors 2 which close the circuit. The plasma guide 1 communicates with a main chamber 3 in which substrate holder 4 that holds substrate 5 is located. Plasma source 6 (a plasma accelerator) is surrounded by the focusing and stabilising electromagnets 7 and 8, respectively. Substrate holder 4 is located off of the optical axis of plasma source 6, preferably at approximately a right angle. On the walls of plasma guide 1 are mounted plates 9 with diaphragm filters, insulated from the chamber walls, which are connected to the positive pole of DC source 10. Plates 9 can be mounted either on one wall of parallelepiped 1, for example, opposite plasma source 6, or on all of its walls which are not occupied by plasma source 6.

In order to form the L-shaped magnetic system (shown in FIG. 2a), the rectangular coils are arranged on the side of the two adjacent walls of the plasma guide 1, one of which adjoins main chamber 3 and the other of which is opposite to plasma source 6. To form the U-shaped magnetic system (shown in FIG. 2b), the rectangular coils must be arranged as follows.

Two rectangular coils should be installed on two walls of parallelepiped-shaped plasma guide 1 (one on the side of plasma source 6 and one on the opposite side) and the third rectangular coil should be installed opposite the plate adjoining main chamber 3. The height of the rectangular coils that form deflecting system should be greater than the height of the walls of the plasma guide 1 in order to reduce the effect of the magnetic field created by the circuit closing conductors. This design makes is possible to avoid deflection of the plasma current towards the lower or upper plane of the plasma guide 1 due to the effect of the magnetic field around the linear conductors 2 arranged along the upper and lower edges of the plasma guide 1.

Figure 2B:
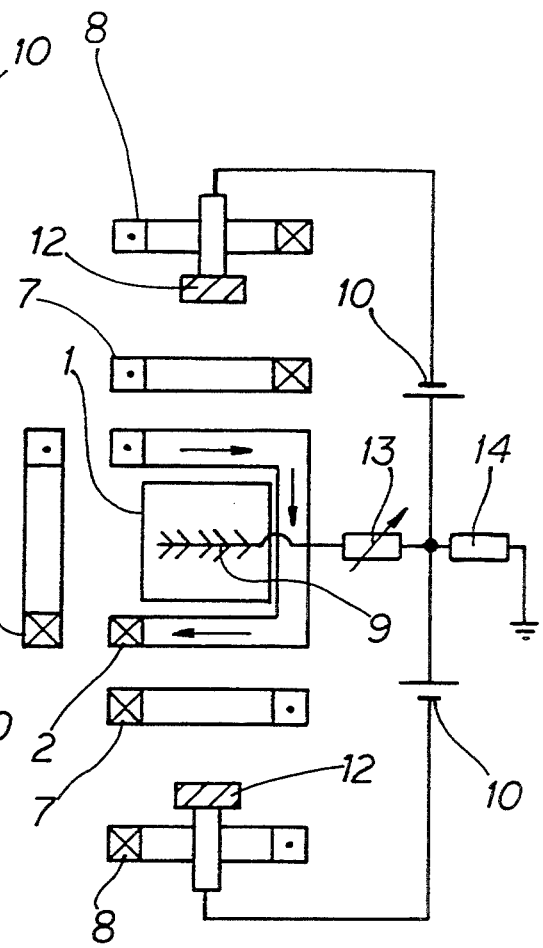

In the case of the U-shaped plasma guide, the apparatus can be provided with one or more plasma sources 6, as shown in FIG. 2b. Two plasma sources 6 are arranged in opposition to each other in one axis. If such a magnetic system is used, the simultaneous engagement of two plasma sources 6 is required.

Figure 2C:
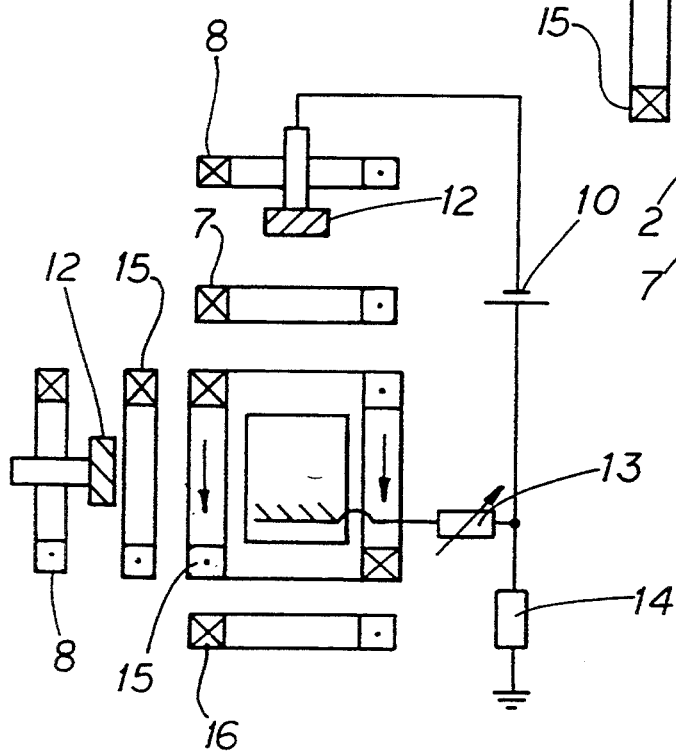

The magnetic deflecting system can also be made up of four rectangular magnetic coils, as in FIG. 2c. Two of the coils are located on the walls of the parallelepiped-shaped plasma guide 1 and the other two coil n the other two sides, i.e. one on the side of the substrate holder 4 and one on the opposite side. With this construction, an additional plasma source 6 can also be included, mounted at a right angle to the first plasma source 6. In this case, the plasma sources 6 are engaged in sequence.

Figure 3:
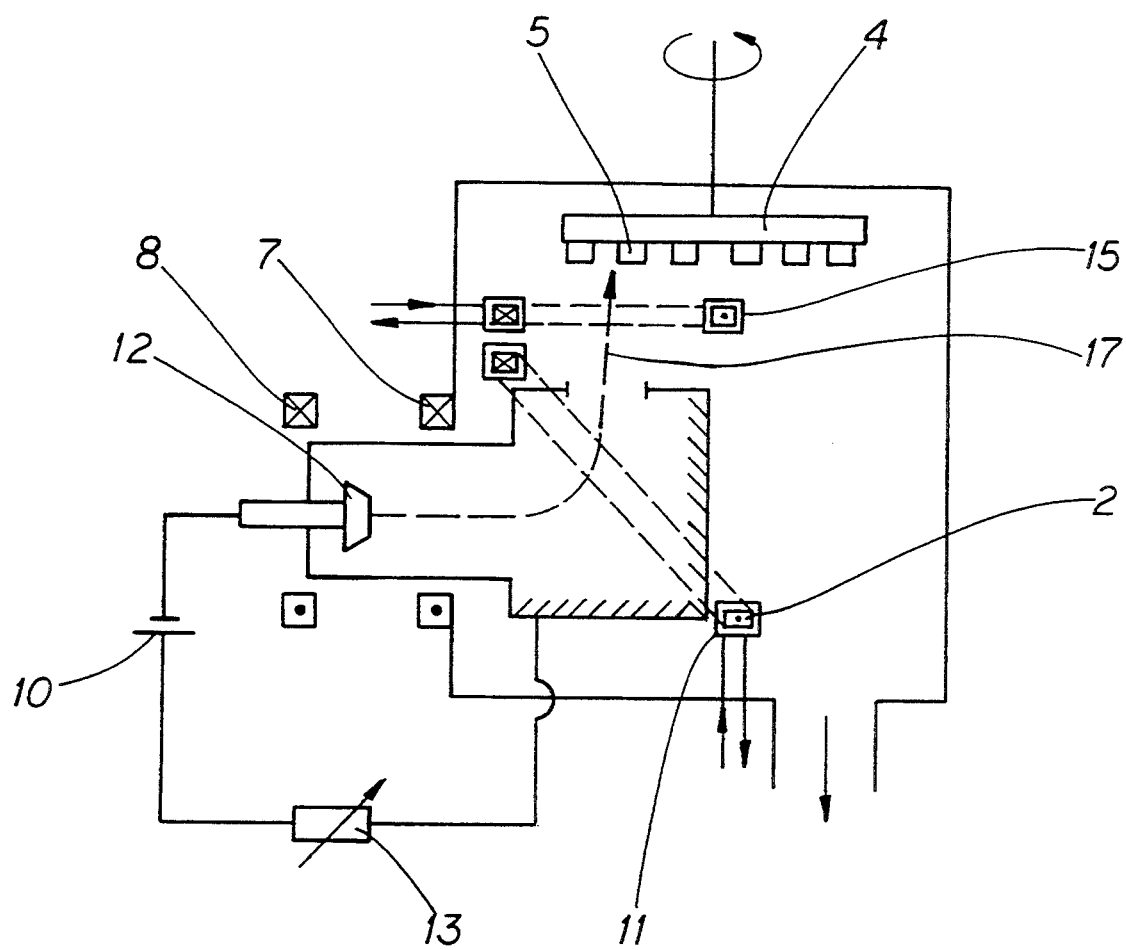
FIG. 3 is a schematic view of an embodiment of the invention with the plasma guide arranged inside the main chamber.

In the embodiment with plasma guide 1 located inside the main chamber 3, rectangular coils are accommodated in metal shells 11 (see FIG. 3) connected to the positive pole of current source 10. An additional current source can also be used for this purpose. This embodiment reduces the size and cost of the apparatus, as an additional vacuum chamber for the electromagnet coils becomes unnecessary.

The walls of plasma guide 1, when the guide is mounted inside the main chamber, are formed by plates 9 with diaphragm filters. The plates 9 are mounted with clearances, i.e. spaced from the walls of the plasma guide 1, to allow the outflow of plasma.

Plasma source 6 includes cathode 12 which is connected to the negative pole of current source 10. Variable resistor 13 is connected between plate 9 and the current source 10. The positive pole of current source 10 is grounded via resistor 14 so as to equalize the potentials of plate 9 and the walls of plasma source 1.

In a preferred embodiment the value of resistor 13 is 0.1 to 0.5 ohm and that of resistor 14 is 3 to 6 ohms. The apparatus also includes a magnetic coil 15 which surrounds substrate holder 4. Should the magnetic system be formed by four rectangular coils, an additional rectangular coil 16 (see FIG. 2c) is installed on the side of the base of plasma guide 1.

The apparatus operates as follows.

Article 5 to be coated is mounted on substrate holder 4 set off the optical axis of plasma source 6. Plasma source 1 is then made airtight and evacuated to the required pressure with the aid of a vacuumatic system. A vacuum arc is generated by means of plasma source 6 (plasma accelerator). The charged plasma component (reference No. 17 denotes the plasma flow) is focused by the magnetic field produced by focusing solenoid 7, propogated into the plasma guide 1 made as a parallelepiped and deflected by the magnetic field of the linear conductors 2 arranged along the edges of the plasma guide (in FIGS. 1, 2 and 3 these linear conductors 2 are arranged at right angle to the plane of the drawing).

When two, three, or four rectangular coils are used, with their appropriate interconnection, (arrows in FIGS. 2a, b, c show the direction of the flow in the circuit closing conductors 2) the current in two adjacent conductors arranged along the edge of the parallelepiped 1 common for two adjacent planes cancel out and the L-shaped, U-shaped or square-shaped magnetic system formed by the linear conductors 2 arranged along the edges of the parallelepiped is obtained (see FIGS. 2a, b, c).

The linear conductors 2 which form magnetic deflecting system 2 and arranged at the exit of plasma guide 1 (on the side of main chamber 3) direct the plasma flow onto substrate holder 4.

A stream of positive-charged ions bounces from positive plates 9 and moves towards substrate 5 (the article to be coated) where it is deposited as a coating. Neutral particles contained in the plasma stream are caught by the diaphragm filters of plates 9.

EXAMPLE

A high-speed steel (grade P6M5) plate sizing 100 mm in width and 500 mm in height was mounted in the substrate holder 4. Titanium was used as the plasma source cathode material. The nitrogen pressure in the main chamber was brought to $6-7.10^{-4}$ GPa.

A negative potential voltage of 250 V was applied to the substrate holder. The arc current in the plasma source was set to 200 A. The application of the titanium nitride coating continued for 30 minutes.

The thickness of the coating was 6 $\mu$m and the variance of the thickness of the coating was not more than 2 percent. No particles of the cathode material larger than 0.1 $\mu$m were found in the coating.

As is seen from the foregoing example, the described apparatus, as opposed to the prior art, allows the user to extend the range of sizes of the articles to be coated, to step up the efficiency of the entire process, and, at the same time, obtain high-quality coatings.

I claim:

1. An apparatus for the application of coatings in a vacuum comprising a plasma guide surrounded by a magnetic deflecting system communicating with a first plasma source contained within the plasma guide and a main chamber adjoining the plasma guide in which a substrate holder is arranged off of an optical axis of the plasma source, the plasma source being surrounded by electromagnets, characterized in that the plasma guide has the form of a parallelepiped and the magnetic deflecting system is formed by linear conductors arranged along edges of the parallelepiped, the plasma guide being provided with plates carrying diaphragm filters, the plates being connected to the positive pole of a current source and installed on one or more walls of the plasma guide which are not occupied by the plasma source.

2. The apparatus defined in claim 1 in which the magnetic deflecting system is formed by one rectangular coil surrounding the parallelepiped-shaped plasma guide diagonally.

3. The apparatus defined in claim 1 in which the magnetic deflecting system is formed by two rectangular coils. which are installed on the side of two adjacent planes of the plasma guide, one of the coils adjoining the main chamber and the other coil being located opposite the plasma source.

4. The apparatus defined in claim 1 in which the magnetic deflecting system is formed by three rectangular coils, two of which are arranged on base plane of the plasma guide and the third of which is mounted opposite a plane adjoining the main chamber, and the apparatus is provided with an additional plasma source installed in opposition to the first plasma source.

5. The apparatus defined in claim 1 in which the magnetic deflecting system is formed by four rectangular coils two of which are arranged along the sides of the plasma guide base, the third coil of which is arranged along the side of the substrate holder and the fourth coil of which is mounted in opposition to the plasma guide, and the apparatus is provided with an additional plasma source mounted at right angles to the first plasma source.

6. The apparatus defined in claim 1 in which the plasma guide is contained in the main chamber, the magnetic deflecting system which surrounds the first plasma source is contained within a metal shell connected to the positive pole of the current source and the walls of the plasma source are formed by plates which bear diaphragm filters, mounted spaced from the walls with clearances to allow an outflow of plasma.

* * * * *